US010895739B2

(12) United States Patent
Yoshimura et al.

(10) Patent No.: US 10,895,739 B2
(45) Date of Patent: Jan. 19, 2021

(54) OPTICAL SCANNING DEVICE, IMAGE PROJECTION DEVICE, AND MOBILE OBJECT

(71) Applicants: Kenichi Yoshimura, Kanagawa (JP); Tomohiro Nakajima, Kanagawa (JP)

(72) Inventors: Kenichi Yoshimura, Kanagawa (JP); Tomohiro Nakajima, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/376,659

(22) Filed: Apr. 5, 2019

(65) Prior Publication Data
US 2019/0310462 A1    Oct. 10, 2019

(30) Foreign Application Priority Data

Apr. 6, 2018   (JP) .................................. 2018-074165
Jan. 29, 2019  (JP) .................................. 2019-012968

(51) Int. Cl.
*G02B 26/10* (2006.01)
*G02B 26/08* (2006.01)
(Continued)

(52) U.S. Cl.
CPC ............. *G02B 26/10* (2013.01); *G02B 7/025* (2013.01); *G02B 26/0833* (2013.01);
(Continued)

(58) Field of Classification Search
CPC ...... G02B 26/10; G02B 7/025; G02B 26/101; G02B 26/0833; G02B 27/0101;
(Continued)

(56) References Cited

U.S. PATENT DOCUMENTS 5,758,950 A   6/1998  Naoe et al.
6,181,363 B1  1/2001  Satoh
(Continued)

FOREIGN PATENT DOCUMENTS

EP   3 267 237 A1   1/2018
JP   9-246657       9/1997
(Continued)

OTHER PUBLICATIONS

Extended European Search Report dated Aug. 5, 2019 in corresponding European Patent Application No. 19164149.7, 22 pages.
(Continued)

*Primary Examiner* — Amit Chatly
(74) *Attorney, Agent, or Firm* — Oblon, McClelland, Maier & Neustadt, L.L.P.

(57) ABSTRACT

An optical scanning device includes: a light source; a scanning unit configured to deflect light from the light source in a main scanning direction to scan a scanned area with light; an optical member configured to guide light from the light source to the scanning unit; a casing holding the light source and the optical member; and an attaching part disposed between the optical member and the casing to attach a part of the optical member to the casing, wherein a direction in which the attaching part is interposed aligns with a direction corresponding to the main scanning direction of the scanning unit.

15 Claims, 12 Drawing Sheets

(51) Int. Cl.
*G02B 27/01* (2006.01)
*G03G 15/043* (2006.01)
*G09G 5/36* (2006.01)
*G02B 7/02* (2006.01)
*B60K 35/00* (2006.01)
*G01C 21/36* (2006.01)
*H01L 33/48* (2010.01)

(52) U.S. Cl.
CPC ....... *G02B 26/101* (2013.01); *G02B 27/0101* (2013.01); *G03G 15/043* (2013.01); *G09G 5/363* (2013.01); *B60K 35/00* (2013.01); *B60K 2370/1529* (2019.05); *G01C 21/365* (2013.01); *H01L 33/483* (2013.01)

(58) Field of Classification Search
CPC .... G03G 15/043; G09G 5/363; H01L 33/483; B60K 2370/1529; B60K 35/00; G01C 21/365
See application file for complete search history.

(56) References Cited

U.S. PATENT DOCUMENTS 6,333,756 B1 * 12/2001 Matsushita ............ G02B 7/028
347/134

2002/0018306 A1 * 2/2002 Andoh ................ G02B 26/12
359/819
2011/0058230 A1 3/2011 Soeda et al.
2013/0278985 A1 * 10/2013 Hino ................... G02B 26/105
359/199.3
2016/0344986 A1 11/2016 Hirakawa

FOREIGN PATENT DOCUMENTS

| JP | 2002-006188 | 1/2002 |
|---|---|---|
| JP | 2011-043690 | 3/2011 |
| JP | 2013-217956 | 10/2013 |
| JP | 2014-013329 | 1/2014 |
| JP | 2014-071223 | 4/2014 |
| JP | 2016-018206 | 2/2016 |
| JP | 2016-218319 | 12/2016 |

OTHER PUBLICATIONS

Office Action dated Apr. 20, 2020 in corresponding European Patent Application No. 19 164 149.7, 6 pages.

European Office Action dated Oct. 8, 2020 in corresponding Application No. EP19164149.7 (filed Mar. 20, 2019).

* cited by examiner

OPTICAL SCANNING DEVICE, IMAGE PROJECTION DEVICE, AND MOBILE OBJECT

CROSS-REFERENCE TO RELATED APPLICATIONS

This patent application is based on and claims priority pursuant to 35 U.S.C. § 119(a) to Japanese Patent Application No. 2018-074165, filed on Apr. 6, 2018 and Japanese Patent Application No. 2019-012968, filed on Jan. 29, 2019, in the Japan Patent Office, the entire disclosure of which is hereby incorporated by reference herein.

BACKGROUND

Technical Field

Embodiments of the present disclosure relates to an optical scanning device, an image projection device, and a mobile object.

Related Art

There has been conventionally known an optical scanning device that includes a light source, a scanning unit for deflecting light from the light source in a main scanning direction to scan a scanned area with the light, an optical member that guides light from the light source to the scanning unit, a casing that holds the light source and the optical member, and an attaching part that attaches the optical member to the casing. For example, a HUD device (optical scanning device) is known that includes a laser diode (light source), an optical scanning unit (scanning unit), a collimator lens (optical member), a housing (casing), and an optical system holding part (attaching part).

In this type of the optical scanning device, the attaching part expands and contracts due to temperature changes, and the position of the optical member relative to the casing may change due to the deformation of the attaching part caused by the expansion and contraction. If the position of the optical member changes, the irradiation position of light emitted from the light source and guided by the optical member to the scanning unit to then reach the scanned area is displaced. In a HUD device including an optical scanning device like the above HUD device, if the irradiation position of light irradiated from the optical scanning device in the scanned area is displaced, the position of an image projected by the HUD device on a projection surface such as a windshield may be shifted.

SUMMARY

An optical scanning device includes: a light source; a scanning unit configured to deflect light from the light source in a main scanning direction to scan a scanned area with light; an optical member configured to guide light from the light source to the scanning unit; a casing holding the light source and the optical member; and an attaching part disposed between the optical member and the casing to attach a part of the optical member to the casing, wherein a direction in which the attaching part is disposed is aligned with the main scanning direction of the scanning unit.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1A:
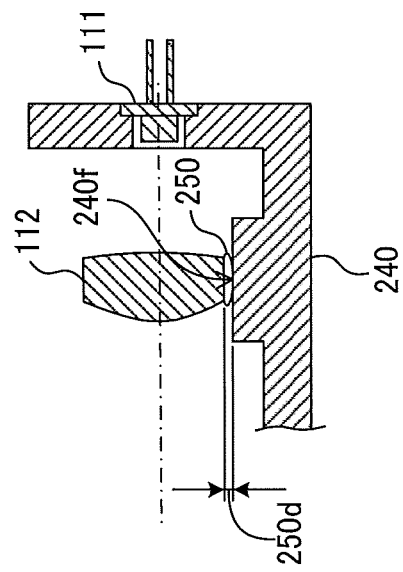
FIGS. 1A and 1B are enlarged explanatory views of an attaching part for attaching a coupling lens to a housing of an optical scanning device according to a first example.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, embodiments of a heads-up display (HUD) device to which an image projection device according to an embodiment of the present disclosure is applicable will be described. The heads-up display (HUD) device functioning as an image projection device is mounted on a mobile object such as a vehicle, an aircraft, and a ship. Navigation information (information such as a speed and a traveling distance) required for steering the mobile object can be visually recognized via a windshield (a front windshield) of the mobile object. In this case, the windshield also functions as a transmission reflection member that transmits a part of incident light and reflects at least some of the remaining incident light. The following description will describe an example in which the heads-up display device is mounted on an automobile that is a mobile object which has a windshield and has a configuration of transmitting drive of a drive source such as an engine and a motor to drive wheels as moving means.

Figure 2:
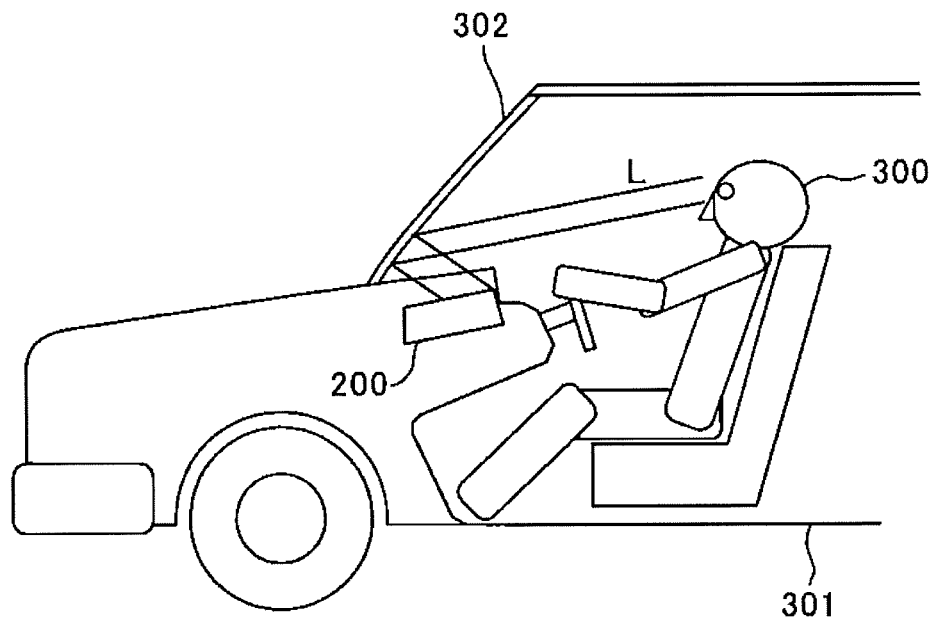
FIG. 2 is a schematic view of an automobile on which an automobile heads-up display device according to an embodiment is mounted.
Figure 3:
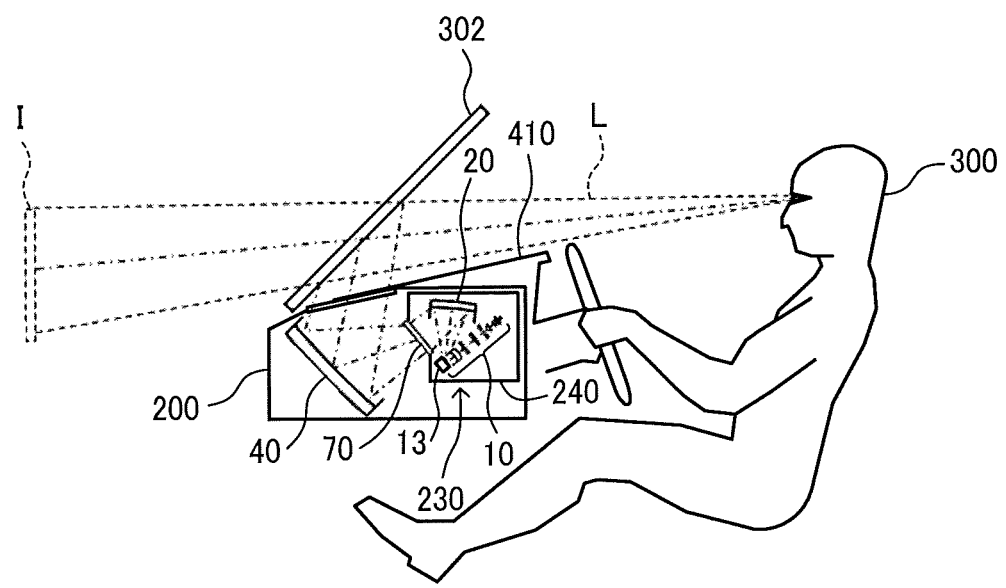
FIG. 3 is an illustration of an example configuration of the heads-up display device.

FIG. 2 is a schematic view of an automobile 301 on which an automobile heads-up display device 200 according to an embodiment of the present disclosure is. FIG. 3 is a schematic configuration view of an example of the heads-up display device 200. As illustrated in FIGS. 2 and 3, the heads-up display device 200 is installed in, for example, a dashboard 410 near a windshield (a windshield 302) of the automobile 301 or the like.

As illustrated in FIG. 3, the heads-up display device 200 includes an imager (an image generation unit) 230, a concave mirror 40, and a casing that houses and holds these components. Display light (projection light) L generated by the imager 230 is irradiated to the outside of the casing via the concave mirror 40, enters the windshield 302, reflected by the windshield 302, and directed to an observer (a driver 300) who is a user. The driver 300 can thus visually recognize an image projected by the heads-up display device 200 or the like as a virtual image I.

Figure 4:
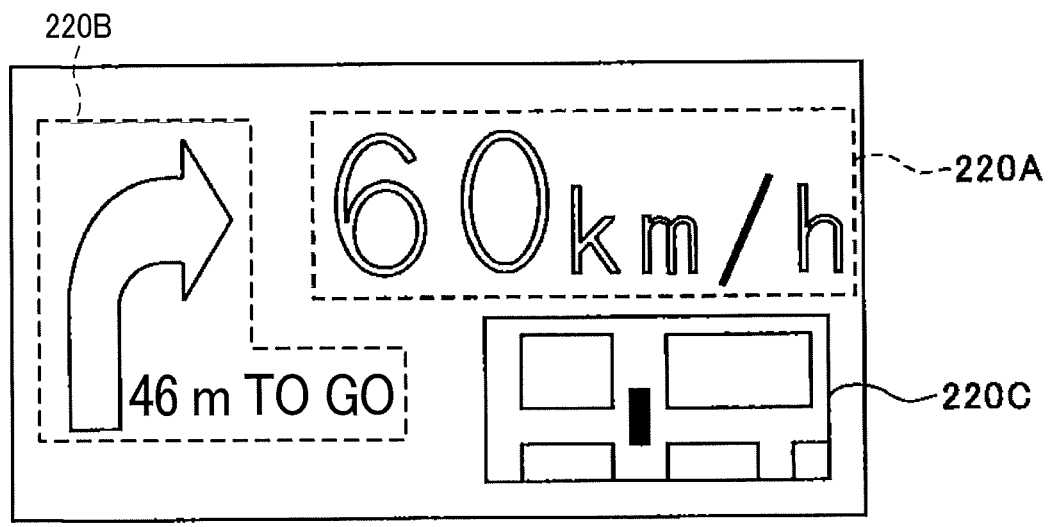
FIG. 4 is an illustration of an example image displayed by the heads-up display device.

FIG. 4 is an explanatory view of an example of an image displayed by the heads-up display device 200. In a navigation image illustrated in FIG. 4, the speed of the automobile 301 (an image "60 km/h" in an example illustrated in FIG. 4) is displayed in a first display area 220A. A navigation image from a car navigation device is displayed in a second display area 220B. In the example illustrated in FIG. 4, a right turn instruction image indicating a direction in which the automobile 301 turns at the next corner and an image "46 m to go" indicating the distance to the next corner are displayed as the navigation image. A map image (an image of a map around a host vehicle) from the car navigation device is displayed in a third display area 220C.

The imager 230 includes a light source unit 10, a light deflector 13, a scanning mirror 20, an intermediate screen 70, a housing 240 that houses these components, and the like. The light source unit 10 includes a light source part 11 which will be described later in detail. In the light source part 11, laser beams of three colors of R, G, and B are combined. The combined laser beam is guided to a reflecting surface 14 of the light deflector 13 and deflected by the light deflector 13.

The light deflector 13 is a micro-electromechanical systems (MEMS) manufactured by any process such as a semiconductor process, and the reflecting surface 14 is a single minute mirror that pivots on two orthogonal axes.

Laser light deflected by the light deflector 13 is folded back by the scanning mirror 20 and depicts a two-dimensional image (an intermediate image) on an intermediate screen 70 functioning as a scanned surface. The display light L, which is the laser light deflected by the light deflector 13, passes through the scanning mirror 20, the intermediate screen 70, and the concave mirror 40 to be projected to the outside of the casing of the heads-up display device 200.

The intermediate screen 70 has a function of diverging the display light L at a desired divergence angle, and preferably has a microlens array structure. The display light L emitted from the intermediate screen 70 enters the windshield 302 via the concave mirror 40 constituted by a single concave mirror, and the virtual image I is displayed to the driver 300 in an enlarged manner.

The present embodiment describes an example in which by reflecting the display light L by the windshield 302 of the automobile 301, a projected image is visually recognized by the driver 300. However, no limitation is intended therein. A combiner for the heads-up display device 200 (an example of a transparent plate having a partial reflection function like the windshield 302) may be separately provided inside the windshield 302. In this configuration, as the combiner reflects the display light L, the driver 300 visually recognizes a projected image.

Figure 5:
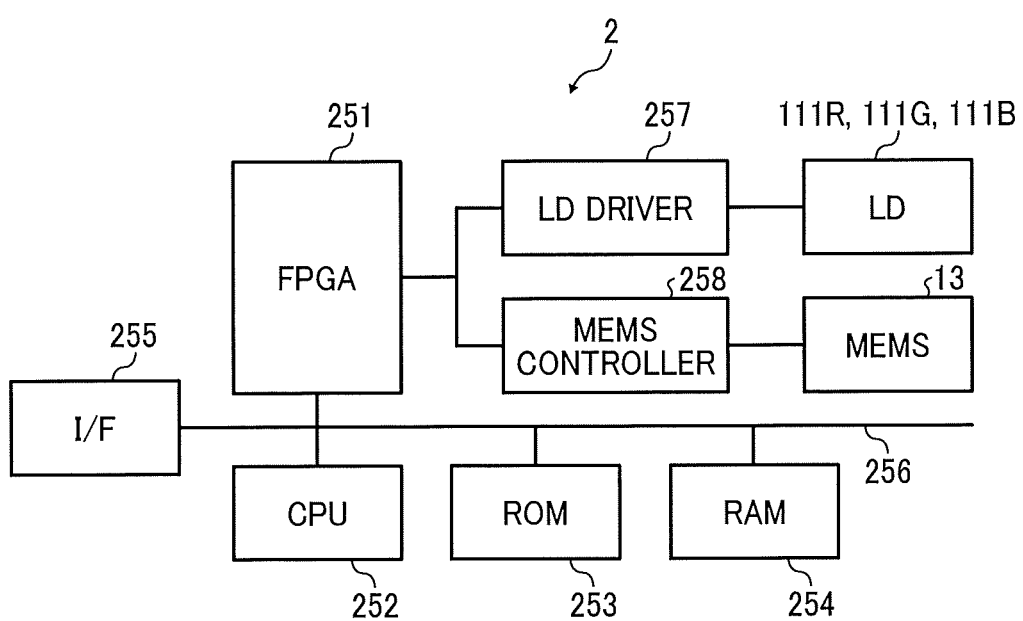
FIG. 5 is a hardware block diagram of a controller of the heads-up display device.

FIG. 5 is a hardware block diagram of a controller 2 of the heads-up display device 200 according to the present embodiment. The control system of the heads-up display device 200 mainly includes an FPGA 251, a CPU 252, a ROM 253, a RAM 254, an I/F 255, a bus line 256, a LD driver 257, and a MEMS controller 258. The FPGA (Field-Programmable Gate Array) 251 controls operations of laser light sources (111R, 111G, and 111B) of the light source unit 10 by the LD driver 257. The FPGA 251 also controls an operation of the MEMS mirror (the light deflector 13) of the optical scanning device 1 to be described later by the MEMS controller 258. The CPU (Central Processing Unit) 252 controls functions of the heads-up display device 200.

The ROM (Read Only Memory) 253 stores various programs such as an image processing program executed by the CPU 252 to control the functions of the heads-up display device 200. The RAM (Random Access Memory) 254 is used as a work area of the CPU 252. The I/F (interface) 255 is an interface to communicate with an external controller, and is connected via a CAN (Controller Area Network) of the automobile 301 to a vehicle navigation device or various sensors, for example.

Figure 6:
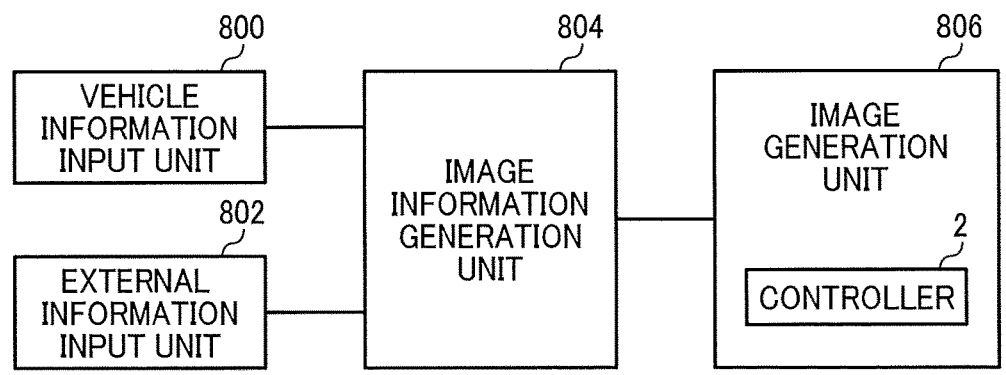
FIG. 6 is a functional block diagram of the heads-up display device.

FIG. 6 is a functional block diagram of the heads-up display device 200. The heads-up display device 200 includes a vehicle information input unit 800, an external information input unit 802, an image information generation unit 804, and an image generation unit 806 (the imager 230 in FIG. 3).

The vehicle information input unit 800 receives vehicle-related information (such as the speed of a vehicle and the travel distance) from the CAN or the like. The external information input unit 802 receives information of the outside of a vehicle (such as navigation information from a GPS) from an external network. The image information generation unit 804 generates image information of an image to be displayed based on information input from the vehicle information input unit 800 and the external information input unit 802. The image generation unit 806 includes the controller 2. As the controller 2 controls the light source unit 10 and the light deflector 13 based on the image information generated by the image information generation unit 804, the image generation unit 806 irradiates the windshield 302 with the display light L. As a result, the virtual image I can be visually recognized from the viewpoint of the driver 300.

Figure 7:
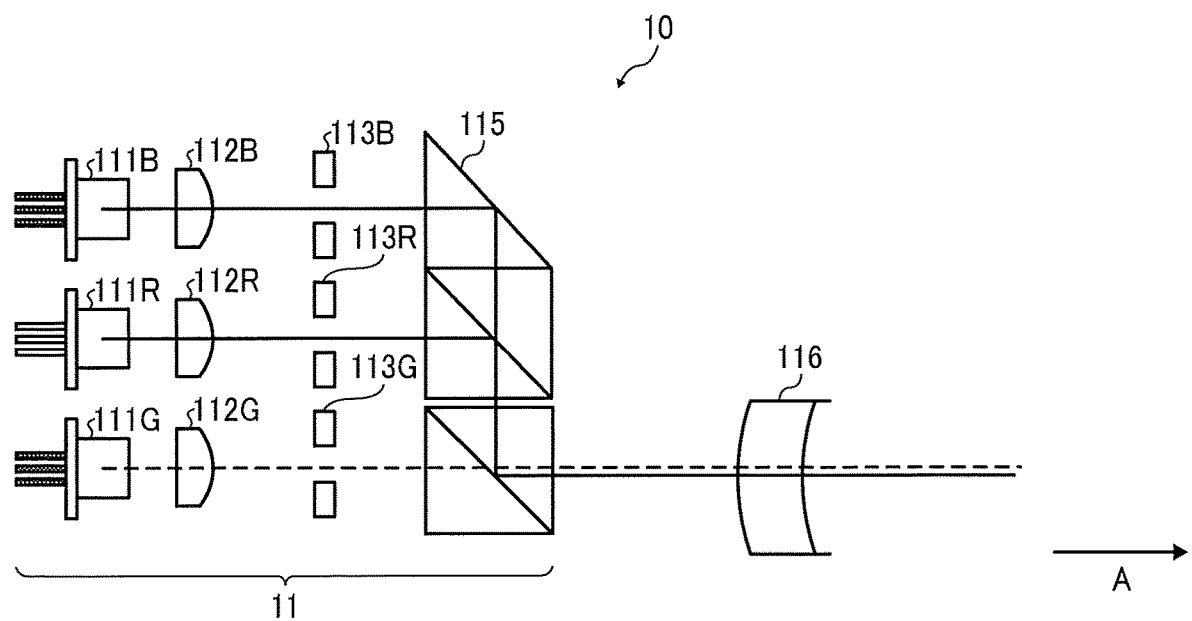
FIG. 7 is an illustration of a light source unit.

FIG. 7 is an explanatory view of the light source unit 10. The light source unit 10 includes the light source part 11 and a meniscus lens 116. The light source part 11 includes three light source elements 111 (111R, 111B, and 111G) having one or more light emitting points. The light source elements 111 are LDs (semiconductor laser devices) and respectively emit light beams having different wavelengths (XR, XG, and XB). For the wavelength of laser light, $\lambda R=640$ [nm], $\lambda G=530$ [nm], and $\lambda B=445$ [nm], for example.

Laser beams with the wavelengths (λR, λG, and λB) emitted from the three light source elements 111 (111R, 111G, and 111B) are coupled to a subsequent optical system by coupling lenses 112 (112R, 112G, and 112B). The coupled laser beams are shaped by apertures 113 (113R, 113B, and 113G). The aperture 113 may have any shape, such as a circle, an ellipse, a rectangle, or a square, according to the divergence angle of laser light.

Optical paths of the laser beams are then combined by an optical path combining element 115. The optical path combining element 115 is a plate or prismatic dichroic mirror to reflect or transmit each of the laser beams therethrough according to the wavelength of each of the laser beams and thus combine the laser beams into one laser beam that travels along one optical path. The combined laser beam is guided to the reflecting surface 14 of the light deflector 13 by the meniscus lens 116. As illustrated in FIG. 7, the meniscus lens 116 has a concave surface facing the light deflector 13. An arrow "A" in FIG. 7 indicates the emission direction of laser light emitted from the light source unit 10.

Figure 8:
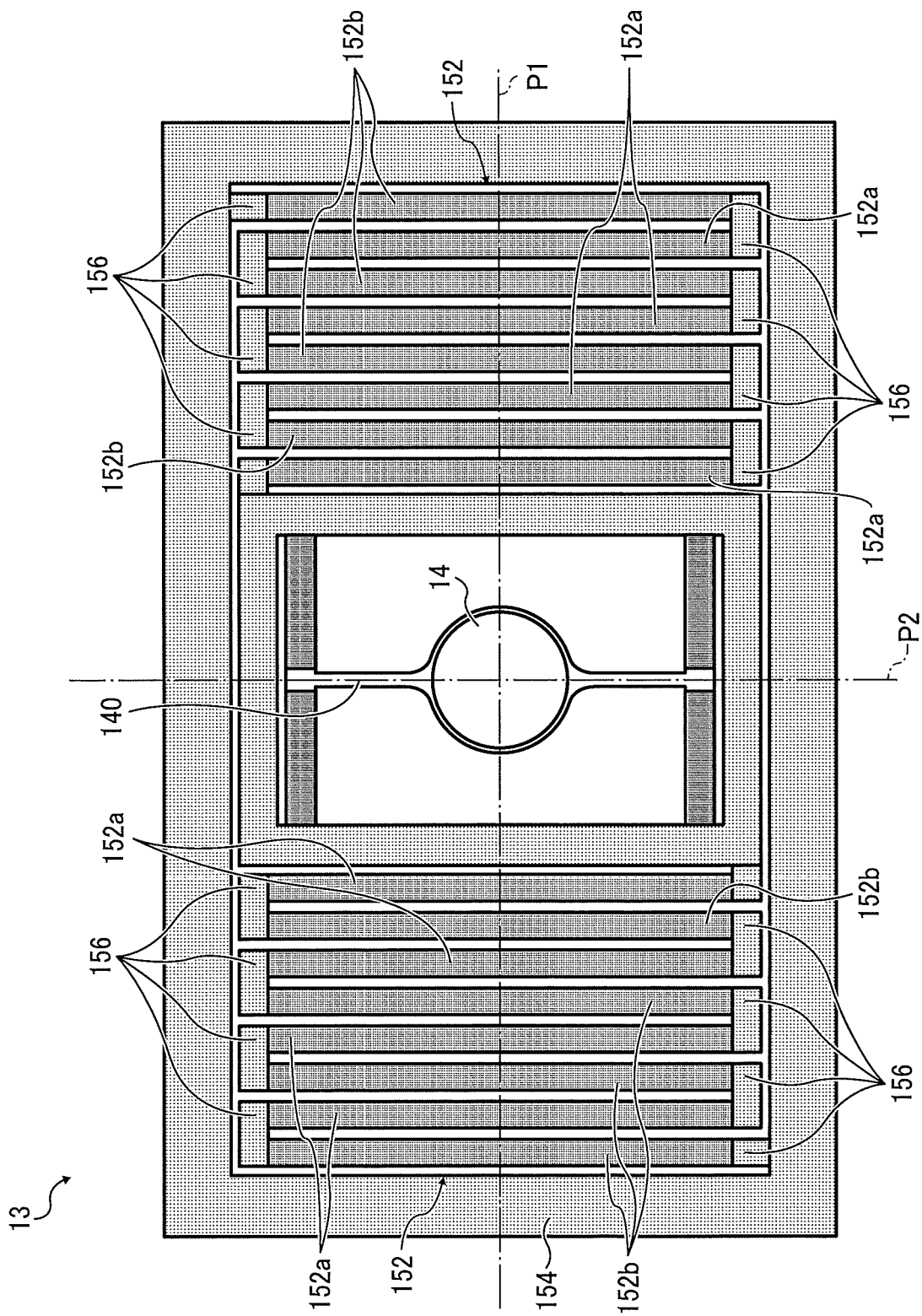
FIG. 8 is a front view of a light deflector including a MEMS mirror.

The light deflector 13 tilts the reflecting surface 14 in a main scanning direction and a sub-scanning direction with a known actuator drive system, and performs two-dimensional scanning (raster scanning) of laser light that is emitted from the light source unit 10 and enters the reflecting surface 14. FIG. 8 is a front view illustrating the light deflector 13 constituted by a MEMS mirror as an example of the light deflector 13. The light deflector 13 of the present embodiment is a MEMS mirror manufactured by a semiconductor process and includes the reflecting surface 14. The light deflector 13 has paired zigzag beam parts 152 that are zigzagged at a plurality of folded portions. In a pair of the zigzag beam parts 152, a first beam part 152a and a second beam part 152b are alternately arranged, and the zigzag beam parts 152 are supported by a frame member 154.

An independent piezoelectric member 156 made of lead zirconate titanate (PZT) or the like is provided for every pair of the zigzag beam parts 152, that is, adjacent beam parts (152a and 152b). By applying different voltages to alternate piezoelectric members 156 to warp the beam parts (152a and 152b), the adjacent beam parts are bent in different directions. Such bending causes the reflecting surface 14 to rotate at a large angle in a vertical direction (the sub-scanning direction). With such a configuration, optical scanning centered on a sub-scanning direction rotating axis P1 illustrated in FIG. 8 can be performed in the vertical direction with lower voltage. On the other hand, in a horizontal direction centered on a main scanning direction rotating axis P2 illustrated in FIG. 8, optical scanning with resonance is performed using a torsion bar 140 that is coupled to the reflecting surface 14. The drive control of the reflecting surface 14 is executed in synchronization with the light emission timing of the light source elements 111 (111R, 111B, and 111G).

The configuration of the light deflector 13 is not limited to the configuration illustrated in FIG. 8. For example, the light deflector 13 may be constituted by a mirror system including two mirrors that pivot or rotate about two orthogonal axes.

Figure 11:
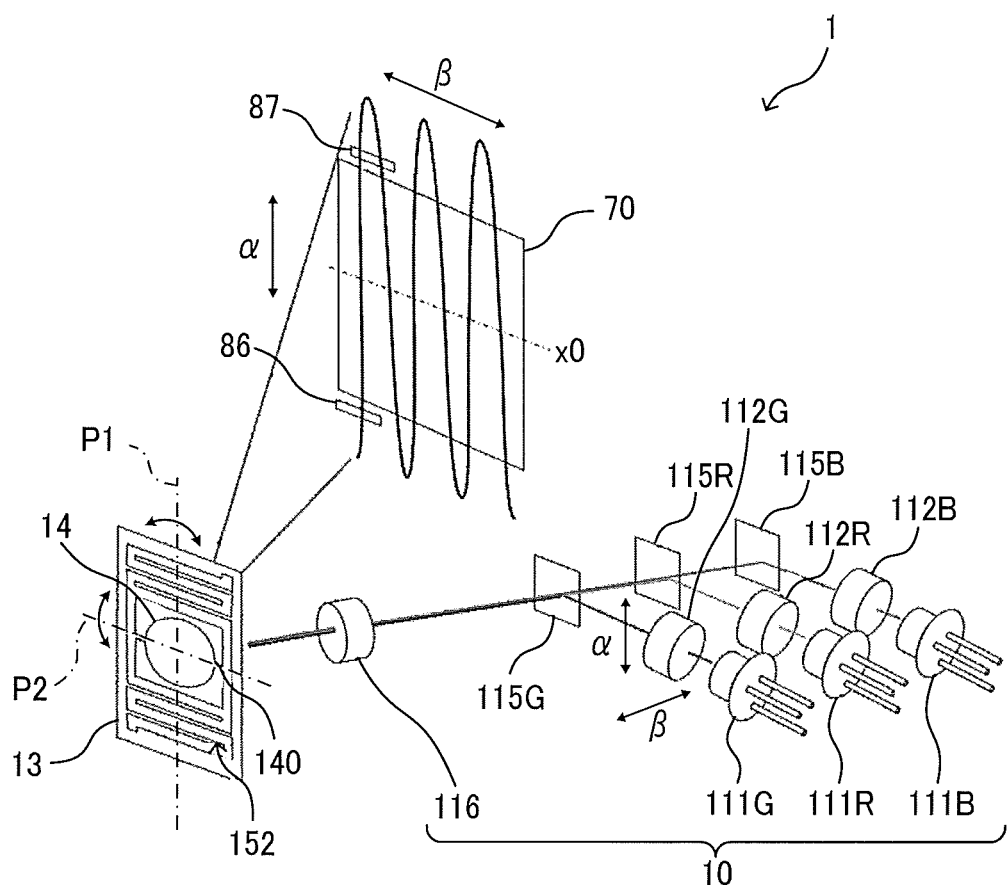
FIG. 11 is a schematic view of an optical scanning device according to an embodiment of the present disclosure.

In the present embodiment, the main scanning direction is a direction along the longitudinal direction of an intermediate image (a direction of an arrow "a" in FIG. 11), and the sub-scanning direction is a direction along a widthwise direction of the intermediate image (a direction of an arrow "β" in FIG. 11). Since the intermediate image in the present embodiment is horizontally long, the main scanning direction is an image lateral direction and the sub-scanning direction is an image vertical direction.

The windshield 302 is usually a curved surface and is inclined in a specific direction with respect to the incident direction of the display light L. The virtual image I rendered by reflecting the display light L by the windshield 302 is optically distorted with respect to an intermediate image. Optical distortion also occurs depending on characteristics of various optical elements on the optical path. Among such optical distortions, the optical distortion in which a horizontal line of the intermediate image (a straight line extending in the image lateral direction) projects upward or downward can be corrected by adjusting the shape of a reflecting surface of the scanning mirror 20 or the concave mirror 40 in the present embodiment. In addition, another optical distortion may occur. In the optical distortion, the entire virtual image I rendered by reflecting the display light L by the windshield 302 may rotate, so that the lateral direction of the virtual image I is inclined with respect to the horizontal direction. Such distortion can be corrected by adjusting the scanning direction of the light deflector 13 so that the intermediate image is formed in a state where the lateral direction of the intermediate image is inclined in advance with respect to the horizontal direction. Moreover, the optical distortion in which the entire image is deformed into a parallelogram can be corrected by image processing.

Figure 9:
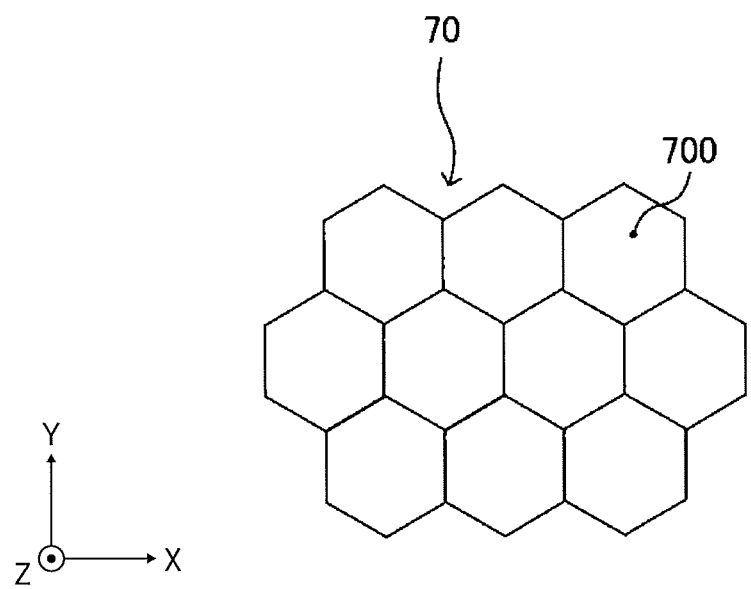
FIG. 9 is an enlarged view of a surface of an intermediate screen.
Figure 10A:
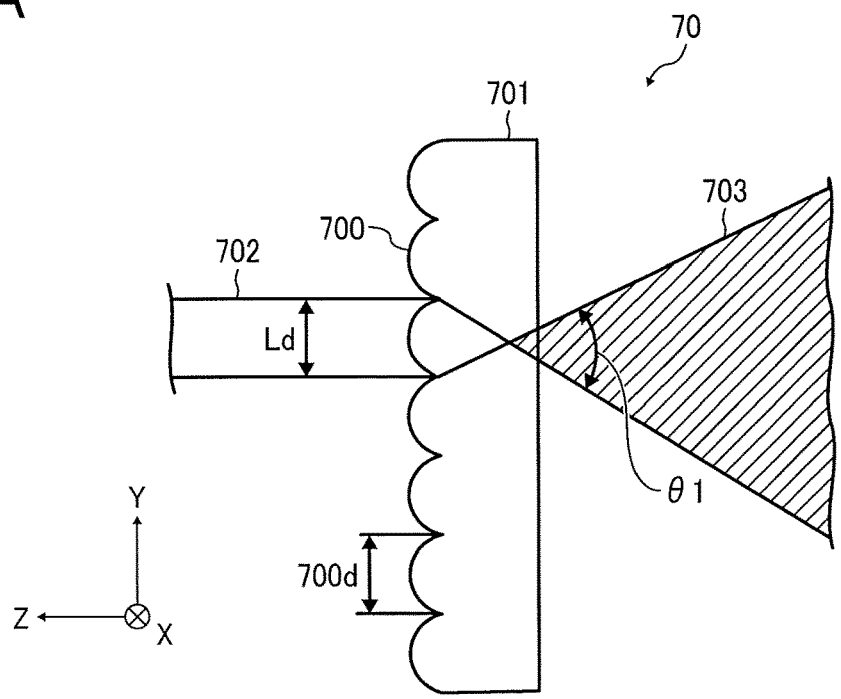
FIGS. 10A and 10B are enlarged cross-sectional views of the intermediate screen, as seen from a direction orthogonal to an optical path.
Figure 10B:
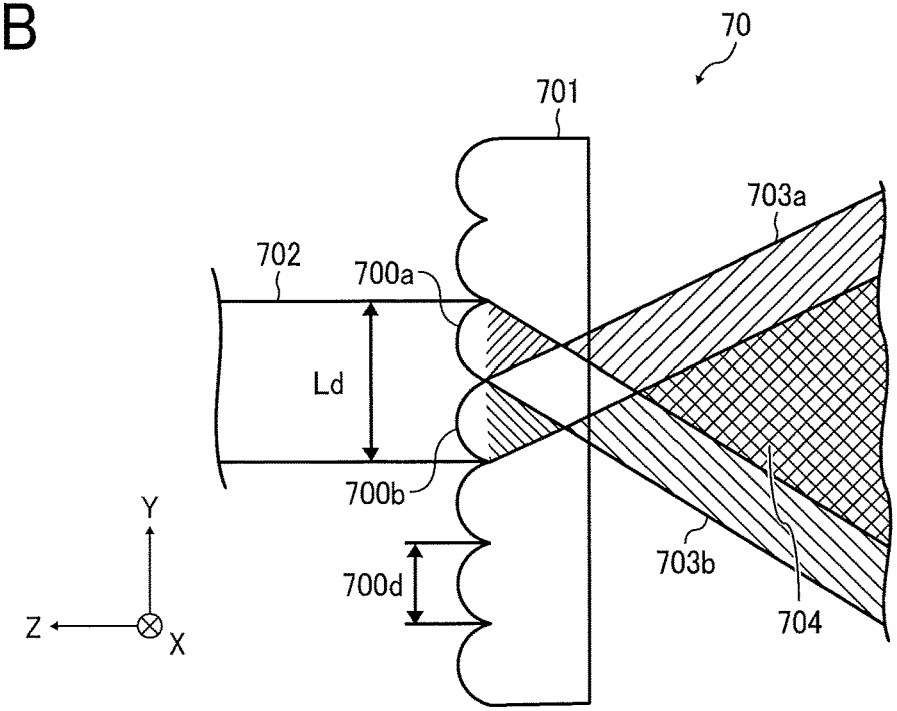

FIG. 9 is an enlarged explanatory view of the surface of the intermediate screen 70. FIGS. 10A and 10B are enlarged cross-sectional views of the intermediate screen 70 as viewed from a direction orthogonal to an optical path. In FIGS. 9, 10A, and 10B, the direction parallel to the propagation direction of the display light L on the intermediate screen 70 is a Z-axis direction, the main scanning direction is an X-axis direction, and the sub-scanning direction is a Y-axis direction.

As illustrated in FIGS. 9, 10A, and 10B, the intermediate screen 70 is constituted by an optical plate 701 in which microlenses 700 are arranged. FIG. 10A illustrates the optical path of diverging light when the diameter (Ld) of an incident light beam 702 incident on the intermediate screen 70 is less than or equal to an arrangement period 700d of the microlenses 700. FIG. 10B illustrates the optical path of diverging light when the diameter (Ld) of the incident light beam 702 is twice as large as the arrangement period 700d.

When the optical plate 701 is scanned with the incident light beam 702, the light beam is diverged by the microlens 700 to become a divergent light beam 703. With the structure of the microlens 700, the incident light beam 702 can be diverged at a desired divergence angle θ1. As illustrated in FIG. 10A, the arrangement period 700d of the microlenses 700 is normally designed to be larger than the diameter (Ld) of the incident light beam 702. Consequently, no interference occurs between the microlenses 700, and generation of speckles can be prevented.

In the state illustrated in FIG. 10B, the incident light beam 702 is incident on the two microlenses 700 (700a and 700b) at the same time. As a result, divergent light beams 703 (703a and 703b) are generated. At this time, since the two divergent light beams 703 (703a and 703b) are present in an area 704 at the same time, light interference may occur. When entering eyes of the driver 300, the interference light beam is visually recognized as speckles. To reduce speckles, the arrangement period 700d of the microlenses 700 is designed to be larger than the diameter (Ld) of the incident light beam 702. In the examples illustrated in FIGS. 9, 10A, and 10B, the microlens 700 of the intermediate screen 70 is a convex lens, but the microlens 700 may be a concave lens.

The heads-up display device 200 of the present embodiment is an in-vehicle heads-up display device that projects the display light L through the windshield 302 by laser scanning to display the virtual image I.

Market expectations for the in-vehicle heads-up display device have been increasing as an application capable of recognizing alarms and information with less line-of-sight movements of drivers. Consequently, the technology development of the in-vehicle HUD (head up display) has been progressing. In particular, along with the progress of in-vehicle sensing technology typified by the term ADAS (Advanced Driving Assistance System), vehicles have become capable of capturing various traveling environment information and occupant information. The HUD has also attracted attention as "exit of ADAS" that conveys such information to a driver.

The projection system of the HUD includes "panel system" and "laser scanning system". "Panel system" is a system of representing an intermediate image by an imaging device such as liquid crystal and DMD (Digital Mirror Device). "Laser scanning system" is a system of two-dimensionally scanning laser light emitted from a laser diode with a two-dimensional scanning device to form an intermediate image. In the latter laser scanning system, unlike the panel system in which the image is formed by partial light blocking over the entire screen emission, emission can be controlled on a pixel-by-pixel basis. Consequently, a high-contrast image can be formed as compared to the panel system.

On the other hand, the HUD with "laser scanning system" forms an image by mixing red light (R) from a LD with an oscillation wavelength of 650 [nm] bandwidth, green light (G) from a LD with an oscillation wavelength of 520 [nm] bandwidth, and blue light (B) from a LD with an oscillation wavelength of 450 [nm] bandwidth. If R, G, and B laser beam spots do not overlap precisely on the intermediate screen 70, color misregistration and bleeding occur, which causes degraded image quality.

A configuration of a light source unit according to a comparative example that holds a light source holding part and an optical system holding part in a positioned state. The light source holding part and the optical system holding part are fixed by laser welding.

In an example method of assembling a semiconductor laser as a light source and a collimator lens coupled to the semiconductor laser, the collimator lens is held by a chuck that can positionally adjust the collimator lens in triaxial (x, y, and z) directions. The collimator lens is disposed on a lens support part for supporting the collimator lens to be concentric with the optical axis of the semiconductor laser. An ultraviolet curing adhesive filled in a gap formed between an adhesion surface of the lens support part and an outer peripheral surface of the collimator lens is cured, so that the collimator lens is fixed on the lens support part. In still another example method of fixing a collimator, an L-shaped intermediate holding member is brought into contact with an edge surface of a lens that is positionally adjusted by a jig, interposed between the lens and a lens support part, so that the lens is bonded and fixed to the lens support part.

The collimator lens adjustment methods described above can simplify the configuration of the light source part and improve the production efficiency. For this reason, these methods are widely used in laser scanning optical systems for use with digital copying machines and laser printers and light source devices using semiconductor lasers as light sources.

In the example collimator lens fixing method as follows. That is, an adhesive layer is filled in the gap between an edge surface of a collimator lens and an adhesion surface of a housing that opposes the edge surface according to the adjusted position of the collimator lens, so that the collimator lens is fixed while being floated (separated) from the adhesion surface. The thickness of the adhesive layer is "0.1 to 0.5 [mm]", and the gap is set so that the collimator lens does not contact the adhesion surface through adjustment. However, since the ambient temperature is severe such as "−40[° C.] to 85[° C.]" in the in-vehicle environment as compared to the office environment, a positional shift may occur due to expansion and contraction caused by a temperature change of the adhesive layer.

In particular, a dashboard under a windshield on which the HUD is mounted is directly affected by the influence of the outside temperature due to weather conditions and the influence of the heat generation due to sunlight entering through the windshield. Consequently, thermal resistance is an important factor. In the HUD in which colors are reproduced by mixing R, G, and B colors, a collimator lens is positioned with respect to a semiconductor laser in each of R, G, and B, and then laser beam spots are overlapped. For this reason, when a spot of a R, G, or B laser beam is positionally shifted, image quality is degraded.

In still another collimator lens fixing method, one side of the L-shaped intermediate holding member is brought into contact with the edge surface of the lens and the other side is brought into contact with the adhesion surface of the housing, and the collimator lens is then fixed while being floated (separated) from the adhesion surface. For this reason, the adhesive layer can be made thin. However, the intermediate holding member is made of a transparent resin that transmits ultraviolet light in some cases, and thus a positional shift due to expansion and contraction of the resin may occur.

The heads-up display device 200 of the present embodiment is configured to apply the adjustment methods of a collimator lens described above to the positional adjustment of the coupling lens 112 with respect to the housing 240. Furthermore, even if the temperature varies by the influence of the outside temperature due to weather conditions or the influence of entering sunlight, a positional shift of a spot of laser light emitted from the light source unit can be avoided and stable image quality can be achieved. More specifically, arrangements are made so that the displacement direction of the coupling lens 112 with respect to the housing 240 due to temperature changes is aligned with the main scanning direction of laser light scanned by the light deflector 13 after passing through the coupling lens 112.

Next, a configuration of the optical scanning device 1 included in the imager 230 of the present embodiment that forms an intermediate image on the intermediate screen 70 will be described. FIG. 11 is a schematic view of the optical scanning device 1 according to the embodiment. Components illustrated in FIG. 11 are integrally housed in the housing 240 illustrated in FIG. 3, are positioned and then fixed.

As described above with reference to FIG. 8, the light deflector 13 includes the reflecting surface 14, the torsion bar 140 that rotatably supports the reflecting surface 14 about the main scanning direction rotating axis P2, and the zigzag beam parts 152 that rotatably support the reflecting surface 14 about the sub-scanning direction rotating axis P1. Laser light beams from the R, G, and B LDs (111R, 111B, and 111G) are batch scanned in the X-axis direction (the main scanning direction α) centered on an amplitude center X0 on the intermediate screen 70 by sinusoidal vibration about the main scanning direction rotating axis P2 on the reflecting surface 14 of the light deflector 13. Further, the irradiation position of laser light is moved in the Y-axis direction (the sub-scanning direction β) by vibration about the sub-scanning direction rotating axis P1 of the reflecting surface 14, so that two-dimensional scanning is performed.

The red LD (111R) with an oscillation wavelength of 650 [nm] bandwidth, the green LD (111G) with an oscillation wavelength of 520 [nm] bandwidth, and the blue LD (111B) with an oscillation wavelength of 450 [nm] bandwidth are used. Laser beams of the respective colors are combined by the optical path combining element 115 that uses dichroic mirrors (115R, 115G, and 115B), and an image is formed on the intermediate screen 70 by the meniscus lens 116 functioning as a condenser lens.

The coupling lenses 112 (112R, 112B, and 112G) are positioned in the optical axis direction so that laser beams from the R, G, and B LDs become light beams with a predetermined focusing property. The coupling lenses 112 are also positioned in the X-axis direction (the main scanning direction α) and the Y-axis direction (the sub-scanning direction β) within the plane orthogonal to the optical axis so that the R, G, and B laser beam spots overlap on the intermediate screen 70, and are bonded and fixed to the housing 240.

A scannable area (a scannable area) near the intermediate screen 70 where the light deflector 13 can scan the plane orthogonal to the optical axis includes an area (an effective scanning area) where an intermediate image is formed on the intermediate screen 70 and is larger than the effective scanning area. The imager 230 according to the present embodiment includes timing sensors (86 and 87) at a portion of the housing 240 that holds the intermediate screen 70, that is, inside of the scannable area and outside of the effective scanning area in the main scanning direction.

The present embodiment is configured that, among R, G and B laser beams scanned by the light deflector 13, the R laser beam is detected by the scanning-start-side timing sensor 86 located at a scanning start position in the main scanning direction to match an image write timing. As described above, since the R, G, and B laser beam spots overlap, these spots cannot be detected at the same time. In the present embodiment, only the R laser beam is turned on and scanned, and the scanning-start-side timing sensor 86 generates an R image write timing signal based on the timing when the R laser beam is detected. A phase difference is given so that the spot positions of the G and B laser beams match that of R, and G and B image write timing signals are generated.

Figure 12A:
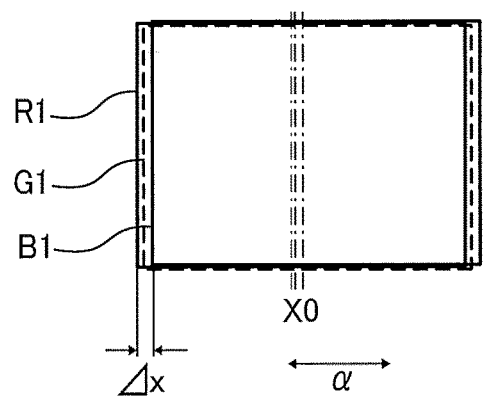
FIGS. 12A and 12B are illustrations of timings of writing three color laser light beams before and after correction.
Figure 12B:
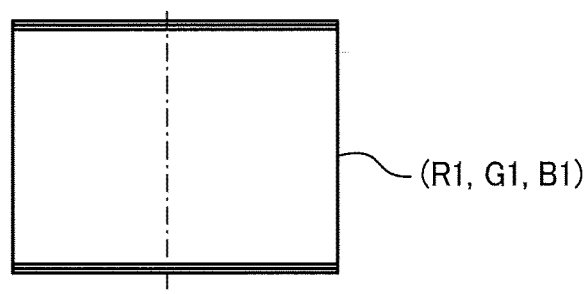

FIGS. 12A and 12B are explanatory views illustrating a state before a timing of writing three-color laser beams (R, G, and B) is corrected (FIG. 12A) and a state after correction (FIG. 12B). When the image write timing of each color laser beam is matched while the amplitude center X0 of each color laser beam is shifted, as illustrated in FIG. 12A, an image of each color (RI, GI, BI) is shifted in the main scanning direction α. A phase difference is given so that the spot positions of the G and B laser beams match that of R, and G and B image write timing signals are generated. Even if overlap of the spots of the R, G, and B laser beams is shifted, the image positions in the main scanning direction can be matched as illustrated in FIG. 12B. The reference laser light does not need to be R. Only the G or B laser light may be turned on and detected by the scanning-start-side timing sensor 86.

On the other hand, in the sub-scanning direction, the indent of image data is adjusted and a scanning line to be written is selected, so that the positions of the respective color images can be matched.

It is desirable that the beam spot on the intermediate screen 70 has an elliptical shape that is long in the sub-scanning direction so as to extend over the space between scanning lines. As adjacent scanning lines of laser beams overlap, the continuity of an image can be achieved. As described above, the phase difference between the other two laser beams and the reference laser beam is set according to the positional shift of each of the R, G and B laser beam spots on the intermediate screen 70. If there is a positional shift of any of the R, G and B laser beam spots, the amplitude center X0 also shifts by the same amount as the positional shift. Consequently, the amplitude center X0 is detected for each color beam and the irradiation timing of laser light for forming an image is adjusted according to the position of the amplitude center X0. As a result, correction can be performed so as to eliminate a positional shift of an image even if there is a change in the ambient temperature or a change over time.

The light deflector 13 reciprocally scans each laser beam in the main scanning direction. As described later, the amplitude center X0 can be detected by measuring the time difference between reciprocating detection signals near an amplitude end. In the present embodiment, the scanning-end-side timing sensor 87 is located at a scanning end position in the main scanning direction. The light detection timing of the scanning-start-side timing sensor 86 and the light detection timing of the scanning-end-side timing sensor 87 are separately detected for each of the R, G and B laser beams.

Specifically, the intermediate timing between the light detection timing of the scanning-start-side timing sensor 86 and the next light detection timing is the timing when laser light irradiates one end of the amplitude. In addition, the intermediate timing between the light detection timing of the scanning-end-side timing sensor 87 and the next light detection timing is the timing when laser light irradiates the other end of the amplitude. The intermediate timing between the timing when laser light irradiates one end of the amplitude and the timing when laser light irradiates the other end of the amplitude is the timing when laser light irradiates the amplitude center X0. The amplitude center X0 of laser light on the intermediate screen 70 is determined by the time difference between the timing when laser light irradiates the amplitude center X0 and the light detection timing of the scanning-start-side timing sensor 86 or the scanning-end-side timing sensor 87, and the positions of these sensors. A phase difference is given, according to the amplitude center X0 of each laser beam, to the timing (the write timing) when laser light for forming an image starts to be irradiated so that the positions of laser images overlap. It is thus possible to correct an image positional shift in the main scanning direction.

For example, in checking operations at a predetermined timing such as when the power supply is turned on, the laser light sources (111R, 111B, and 111G) described above are sequentially turned on, the amplitude center X0 of each light source is detected, and the phase difference of the write timing is set. As a result, image positions can be corrected so as to overlap with each other. In addition, if the relationship between the ambient temperature and the shift of each amplitude center X0 is found in advance, a temperature detection element such as a thermistor may be provided to set the phase difference of the write timing.

In the present embodiment, the FPGA 251 includes an operation sequence based on the above-described function of correcting an image positional shift. In general, the displacement of sinusoidal vibration is uniquely determined by three parameters, that is, a period "T", an amplitude "A", and a phase "δ". In the optical scanning device 1 of the present embodiment, the period "T" is determined by a reference clock set according to the resonance frequency of the MEMS mirror (the light deflector 13). The amplitude "A" is determined by an input current.

Figure 13A:
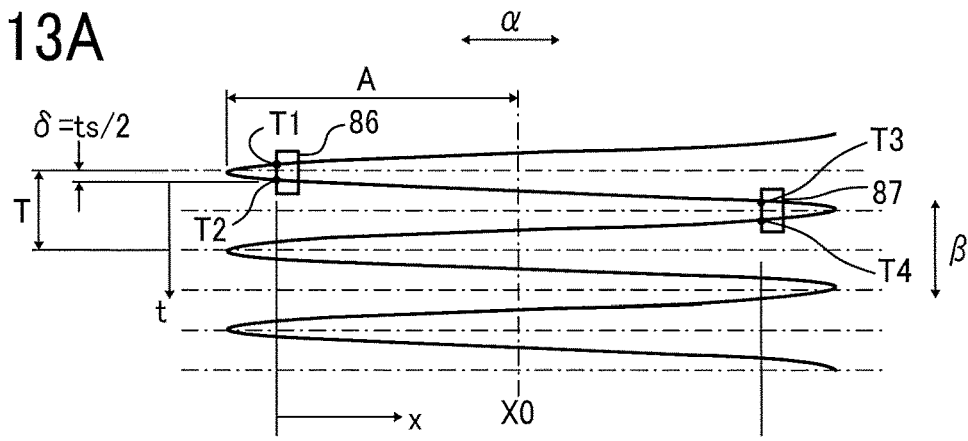
FIGS. 13A, 13B, and 13C are illustrations of a relationship between a timing of detecting laser light by a timing sensor and a writing timing of each color LD.
Figure 13B:
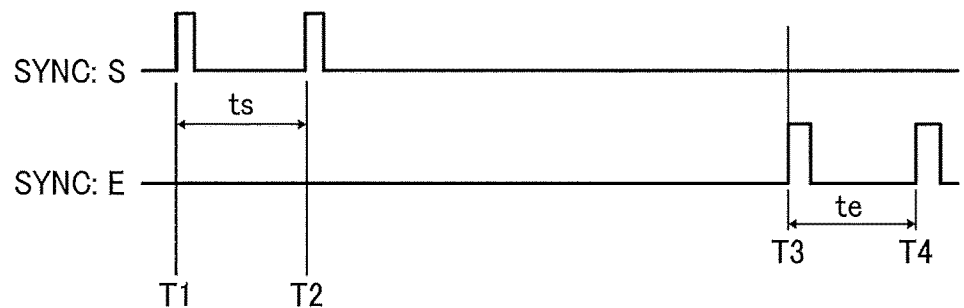
Figure 13C:
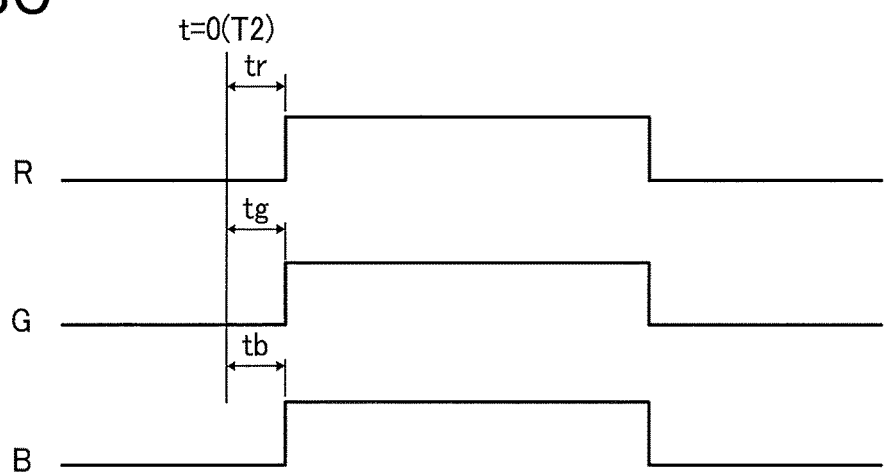

FIGS. 13A, 13B, and 13C are explanatory views schematically illustrating a relationship between a timing of detecting laser light by a timing sensor (86, 87) and a write timing of each color LD. FIG. 13A is a schematic view illustrating the relationship between the irradiation position of laser light scanned by the light deflector 13 in the main scanning direction α near the intermediate screen 70 and the time. In FIG. 13B, "SYNC: S" indicates the detection timing (T1, T2) of the scanning-start-side timing sensor 86, and "SYNC:E" indicates the detection timing (T3, T4) of the scanning-end-side timing sensor 87. FIG. 13C illustrates the irradiation timing of an image signal of each color (R, G, B) LD.

As illustrated in FIG. 13A, the scanning-start-side timing sensor 86 is disposed to be closer to the amplitude center X0 than an amplitude end of laser light from the MEMS mirror (the light deflector 13). Consequently, by reciprocating scanning in the main scanning direction, a laser light detection signal is output twice (T1 and T2). When the time difference between the detection timings of the two detection signals is denoted by "ts" as illustrated in FIG. 13B, the phase "δ" from the amplitude end to the detection performed by the scanning-start-side timing sensor 86 is "δ=ts/2".

Consequently, a position "X" of a laser light spot on the intermediate screen 70 at any time when the position of the scanning-start-side timing sensor 86 is set to "X=0" is represented by the following equation (1) using time "t" from a detection signal of the scanning-start-side timing sensor 86. Among the laser light detection timings "T1" and "T2" of the scanning-start-side timing sensor 86, the second detection timing "T2" is set to "t=0".

$$X=A[1-\cos\{2\pi(t+\delta)/T\}]-A\{1-\cos(2\pi(\delta)/T)\}=A[\cos(2\pi(\delta)/T)-\cos\{2\pi(t+\delta)/T\}] \quad (1)$$

As illustrated in FIG. 13C, the LD driver 257 functioning as a light source controller sets write timings "tr", "tg", and "tb" for the respective semiconductor lasers in accordance with R, G, and B image signals, and adjusts the write timing so that image positions overlap with each other. If the amplitude center X0 varies due to a variation in the position of a member constituting an optical system, the phase "δ" from the amplitude end may shift.

In the present embodiment, a timing sensor (the scanning-end-side timing sensor 87) is also disposed on the scanning end side of the intermediate screen 70. The time difference "te" between two output timings (T3 and T4) of laser light detection signals from the scanning-end-side timing sensor 87 is then detected. The variation in the amplitude center X0 is monitored according to a change in the time difference "ts" on the scanning start side and a change in the time difference "te" on the scanning end side. When the amplitude center X0 varies, one of the two time differences "ts" and "te" increases and the other decreases. Consequently, the phase "δ" may be shifted by an amount corresponding to this change.

As illustrated in FIG. 13C, the write timing "tr" is adjusted for the R semiconductor laser (LD), the write timing "tg" is adjusted for the G semiconductor laser (LD), and the write timing "tb" is adjusted for the B semiconductor laser (LDs), respectively. If the position "X" of the spot of each of the R, G, and B laser beams is shifted on the intermediate screen 70, it is possible to perform correction so that image positions overlap with each other.

In the present embodiment, the time difference "ts" is detected by the scanning-start-side timing sensor 86 disposed on the scanning start side and the time difference "te" is detected by the scanning-end-side timing sensor 87 disposed on the scanning end side, and the variation in the amplitude center X0 is monitored using a change in the time difference. The amplitude "A" is constant, though. If the time difference "ts" on the scanning start side or the time difference "te" on the scanning end side is detected and a deviation from an initial value is monitored, the variation amount of the amplitude center X0 can be detected.

By detecting the position of the amplitude center X0 on the intermediate screen 70, it is possible to detect the positional shift of the laser light irradiation position (the spot) in the main scanning direction α. Based on a detection result, the LD driver 257 controls the timing of writing laser light for forming an image in the effective scanning area of the intermediate screen 70. As a result, if the laser light irradiation position shifts, it is possible to perform correction of forming an image at an appropriate position on the intermediate screen 70.

In the optical scanning device 1 of the present embodiment, arrangements are made so that the displacement direction of the coupling lenses 112 with respect to the housing 240 due to temperature changes is aligned with the main scanning direction α of laser light scanned by the light deflector 13. In this arrangement, when the coupling lens 112 is displaced due to temperature changes, the coupling lens 112 is displaced in the main scanning direction α. The irradiation position of laser light that is transmitted through the coupling lens 112 to be irradiated to the intermediate screen 70 is also shifted in the main scanning direction α. A positional shift in the main scanning direction α is thus generated. As the LD driver 257 controls the laser light write timing as described above, the positional shift of the irradiation position in the main scanning direction α can be corrected so that an image is formed at an appropriate position on the intermediate screen 70. The optical scanning device 1 of the present embodiment has an excellent effect of avoiding a failure due to the deformation of the attaching part for attaching the coupling lens 112 to the housing 240 caused by temperature changes.

Next, an example will be described. In the example, arrangements are made so that the displacement direction of the coupling lenses 112 with respect to the housing 240 due to temperature changes is aligned with the main scanning direction of laser light scanned by the light deflector 13.

FIRST EXAMPLE

Figure 1B:
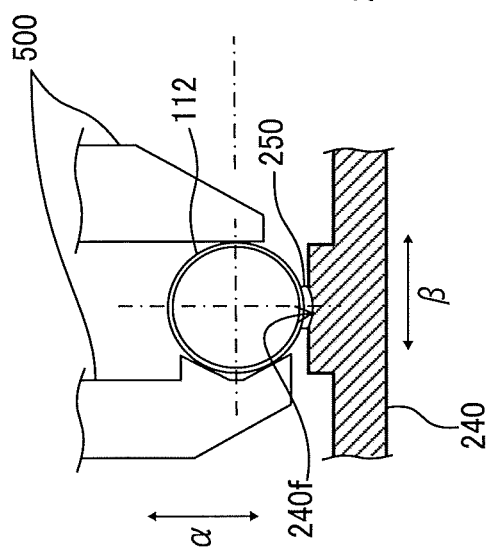

FIGS. 1A and 1B are enlarged explanatory views of an attaching part for attaching the coupling lens 112 to the housing 240 of the optical scanning device 1 in the imager 230 according to a first example. FIG. 1A is an explanatory view of an X-Y plane orthogonal to an optical axis. FIG. 1B is an explanatory view of a Z-Y plane parallel to the optical axis. FIG. 1A is a cross-sectional view taken at the space between the coupling lens 112 and the light source element 111. FIG. 1B is a cross-sectional view of a center portion of the coupling lens 112.

In the imager 230 of the first example, the coupling lens 112 is fixed to the housing 240 by a method similar to the method of bonding and fixing a collimator lens described in Japanese Patent Application Publication No. 9-246657. Lenses similar to the collimator lenses described in Japanese Patent Application Publication Nos. 9-246657 and 2002-006188 can be used as the coupling lens 112.

The housing 240 on which an adhesion surface is formed and the coupling lens 112 are made of different materials. For example, the coupling lens 112 is made of glass whereas the housing 240 is made of ADC (aluminum die-cast). The adhesive that forms an adhesive layer 250 is an acrylic resin ultraviolet curing adhesive or a silicon resin ultraviolet curing adhesive with low hardness so that peeling does not occur if a difference in linear expansion is generated due to the difference in material between the coupling lens 112 and the housing 240.

When there is a difference in linear expansion in applications with large temperature variations such as those for in-vehicle environments, the interfacial failure of the adhesion surface and the cohesive failure of the adhesive occur due to shearing stress. It is thus necessary to select an adhesive with low hardness for the purpose of absorbing the difference in linear expansion through flexibility and maintaining adhesive strength. On the other hand, the coupling lens 112 may be positionally shifted due to expansion and contraction of the adhesive due to temperature changes. If the coupling lens 112 is positionally shifted, the light emitting point of a semiconductor laser (LD) deviates from the axis of the coupling lens 112, the optical axis of the laser light shifts, so that the positional shift of the laser light spot is generated on the intermediate screen 70.

As illustrated in FIG. 1, the adjustment of the coupling lens 112 is performed as follows. That is, the coupling lens 112, which is chucked by a chucking jig, is positioned with respect to the housing 240 that supports the semiconductor laser (the light source element 111). Specifically, positioning is performed within a plane orthogonal to the optical axis in the X-axis direction and the Y-axis direction. An ultraviolet curing adhesive is applied in advance to the gap between the edge surface of the coupling lens 112 and an opposing adhesion surface 240$f$ of the housing 240 and then cured, so that the coupling lens 112 is fixed in a state where the optical axis is positioned with respect to the semiconductor laser (the light source element 111).

The adhesion surface 240$f$ is formed concentrically with the edge surface of the coupling lens 112. The adhesive layer 250 is filled in the gap between the edge surface and the opposing adhesion surface 240$f$ of the housing 240 according to the adjusted position of the coupling lens 112. As a result, the coupling lens 112 is fixed in a state of being floated (separated) from the adhesion surface 240$f$. The thickness of the adhesive layer 250 is "0.1 to 0.5 [mm]", and the gap is set so that the coupling lens 112 does not contact the adhesion surface 240$f$ by positional adjustment with respect to the housing 240.

However, since the ambient temperature is severe such as "−40[° C.] to 85[° C.]" in the in-vehicle environment as compared to the office environment, a positional shift due to expansion and contraction of the adhesive layer 250 caused by temperature changes cannot be ignored. In the heads-up display device 200 configured to reproduce colors by mixing R, G, and B laser beams, the coupling lens 112 is positioned with respect to the semiconductor laser (the light source element 111) for each of R, G, and B. For this reason, if a spot of any of the R, G, and B laser beams is positionally shifted, image quality is degraded.

In the method of bonding and fixing the coupling lens 112 used in the first example, the expansion and contraction of the adhesive layer 250 vary greatly in the thickness (reference numeral "250$d$" in FIG. 1B) direction. It is thus possible to easily specify a shift direction as compared with a method of bonding the circumference of the coupling lens 112 at a plurality of locations. That is, the shift due to the expansion and contraction may be anisotropic so as to be difficult to be generated in a shearing direction (the horizontal direction in FIG. 12A) and be highly sensitive in the thickness direction (the vertical direction in FIG. 12A). This is because the structure illustrated in FIG. 1A is symmetric in the horizontal direction (the direction parallel to the adhesion surface), but is asymmetric in the vertical direction (the direction orthogonal to the adhesion surface).

If the positional shift of a display image is eliminated even though there is a positional shift due to the variation in the thickness direction, the image quality can be maintained even if there is a change in ambient environment temperature and a change over time due to repeated expansion and contraction. As described above, in the optical scanning device 1 of the present embodiment, scanned laser light is detected in the main scanning direction α by the timing sensors (86 and 87) respectively arranged on the scanning start side and the scanning end side of the intermediate screen 70. If overlap of laser light spots is shifted, it is possible to correct the positional shift of each of R, G, and B images based on the detection result. In the first example, the adhesion surface 240$f$ is formed on the housing 240 to which the R, G, and B semiconductor lasers (the light source elements 111) of R, G, and B are fixed so that the thickness direction of the adhesive layer 250 is aligned with the main scanning direction α (the X-axis direction). It should be noted that the main scanning direction α is a direction for main scanning via a mirror, a lens, or the like.

SECOND EXAMPLE

Figure 14A:
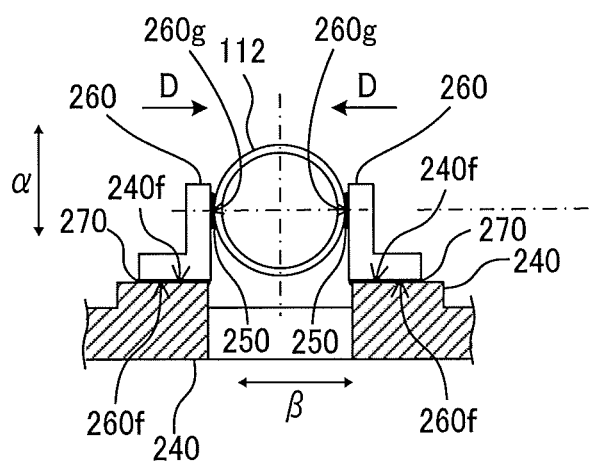
FIGS. 14A and 14B are enlarged views of an attaching part for attaching a coupling lens to a housing of an optical scanning device according to a second example.
Figure 14A:
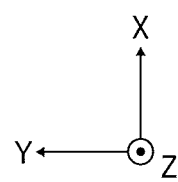
Figure 14B:
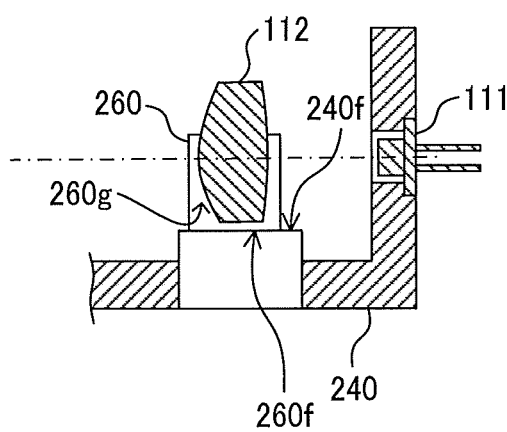
Figure 14B:
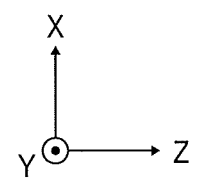

FIGS. 14A and 14B are enlarged explanatory views of an attaching part for attaching the coupling lens 112 to the housing 240 of the optical scanning device 1 in the imager 230 according to a second example. FIG. 14A is an explanatory view of an X-Y plane orthogonal to an optical axis. FIG. 14B is an explanatory view of a Z-Y plane parallel to the optical axis. FIG. 14A is a cross-sectional view taken at the space between the coupling lens 112 and the light source element 111. FIG. 14B is a cross-sectional view of a center portion of the coupling lens 112.

In the imager 230 of the second example, the coupling lens 112 is fixed to the housing 240 by a method similar to the method of bonding and fixing a collimator lens described in Japanese Patent Application Publication No. 2002-006188. Lenses similar to the collimator lenses described in Japanese Patent Application Publication Nos. 9-246657 and 2002-006188 can be used as the coupling lens 112.

In the second example, positioning is performed with respect to the housing 240 that supports a semiconductor laser (LD) within the plane orthogonal to the optical axis (the X-Y plane) in the X-axis direction and the Y-axis direction. The edge surface of the coupling lens 112 is then brought into contact with a lens holding surface 260$g$ that is vertical to an intermediate holding member adhesion surface 260$f$ formed on a lens intermediate holding member 260, and these surfaces are joined to each other by an ultraviolet curing adhesive. In the second embodiment, the paired lens intermediate holding members 260 are used to sandwich the coupling lens 112 in the sub-scanning direction β (the Y-axis direction), and then bond and fix the coupling lens 112. The intermediate holding member adhesion surface 260f of the lens intermediate holding member 260 opposes the adhesion surface 240f of the housing 240 and is bonded to the adhesion surface 240f by an intermediate holding member adhesive layer 270. The edge surface of the coupling lens 112 is bonded to the lens holding surface 260g by the adhesive layer 250.

In this bonding and fixing method, a positional shift due to expansion and contraction of the lens intermediate holding member 260 hardly occurs in a sandwiching direction (a direction of an arrow "D" in FIG. 14A). The positional shift is anisotropic so as to be sensitive along the direction orthogonal to the sandwiching direction "D", that is, along the normal direction of the intermediate holding member adhesion surface 260f.

The lens intermediate holding member 260 of the second example is made of a transparent resin thus hardly blocks irradiation of ultraviolet rays to the adhesive layer 250 made of an ultraviolet curing adhesive and the intermediate holding member adhesive layer 270. The lens intermediate holding member 260 made of a resin material is a member whose coefficients of expansion and contraction due to temperature change are higher than those of the housing 240.

The intermediate holding member adhesive layers 270 for fixing the lens intermediate holding member 260 to the housing 240 are arranged asymmetrically in the vertical direction with respect to the coupling lens 112. When the lens intermediate holding member 260 expands and contracts due to temperature changes, the distance between the intermediate holding member adhesion surface 260f bonded to the housing 240 by the intermediate holding member adhesive layer 270 and the coupling lens 112 varies. As a result, when the temperature changes, the position of the coupling lens 112 with respect to the housing 240 easily varies in a direction orthogonal to the intermediate holding member adhesion surface 260f. This is because the structure illustrated in FIG. 14A is symmetric in the horizontal direction but is asymmetric in the vertical direction in the drawing.

In the second example, the intermediate holding member adhesion surface 260f of the intermediate holding member 260 is formed so that the direction vertical to the adhesion surface 240f of the housing 240 and orthogonal to the direction "D" in which the lens intermediate holding members 260 sandwich the edge surface is aligned with the main scanning direction α (the X-axis direction). In the optical scanning device 1 of the present embodiment, if overlap of laser light spots is shifted, it is possible to correct a positional shift of each of R, G, and B images in the main scanning direction α based on the detection results of the timing sensors (86 and 87). Similarly to the first example, image quality can be maintained even if there is a change in ambient environment temperature and a change over time due to repeated expansion and contraction.

In the second example, the adhesive layer 250 between the coupling lens 112 and the lens intermediate holding member 260 may also expand and contract due to the change in ambient environmental temperature. However, the adhesive layers 250 of the second example are formed to be symmetric with respect to the Y-axis direction with the coupling lens 112 interposed therebetween. Consequently, a change in the thickness of the adhesive layer 250 is eliminated, and the position of the coupling lens 112 hardly vary.

On the other hand, the intermediate holding member adhesive layer 270 between the lens intermediate holding member 260 and the housing 240 may also expand and contract due to the change in ambient environmental temperature. The intermediate holding member adhesive layer 270 is disposed only on one side of the coupling lens 112 and is formed asymmetrically in the vertical direction with respect to the coupling lens 112. For this reason, when the thickness of the intermediate holding member adhesive layer 270 changes, the position of the coupling lens 112 may change accordingly. However, since the thickness direction of the intermediate holding member adhesive layer 270 aligns with the main scanning direction, it is possible to correct a positional shift of an image based on the detection results of the timing sensors (86 and 87) and keep image quality.

The optical scanning device 1 of the present embodiment includes three semiconductor lasers (the light source elements 111) as a plurality of laser light sources having different wavelengths. The optical scanning device 1 also includes collimator lenses (the coupling lenses 112), a dichroic mirror (the optical path combining elements 115), a MEMS mirror (the light deflector 13), timing sensors (86 and 87), a laser light source controller (the LD driver 257), and the housing 240.

The collimator lenses (the coupling lenses 112) are disposed at positions respectively opposing the plurality of semiconductor lasers, and the relative positions with respect to the semiconductor lasers are adjusted so that a plurality of laser beams from the semiconductor lasers overlap on the intermediate screen 70. The dichroic mirror (the optical path combining elements 115) combines a plurality of laser beams, and the MEMS mirror (the light deflector 13) reciprocally scans the laser beam combined in the main scanning direction α and in the sub-scanning direction β in a batch manner. The timing sensors (86 and 87) are an optical detector for detecting the incidence of laser light scanned by the MEMS mirror. The laser light source controller (the LD driver 257) displays an image on the intermediate screen 70 in the exact image write timing based on a detection signal of the optical detector. The housing 240 integrally holds the members of the optical system constituting the optical scanning device 1.

According to the optical scanning device 1 of the present embodiment, in bonding and fixing the coupling lenses 112 constituting the light source part 11, the adhesion surface 240f is formed so that a shift direction according to temperature changes is anisotropic (directive). Furthermore, the shift direction according to temperature changes is caused to align with the main scanning direction, laser light scanned in the main scanning direction is detected, and the timing of writing a display image is controlled. As a result, if the coupling lens 112 is positionally shifted due to temperature changes, it is possible to avoid degraded image quality such as color misregistration and bleeding.

The optical scanning device 1 of the first embodiment is configured to bond and fix one side of the edge surface of the coupling lens 112 to the adhesion surface 240f formed on the housing 240. A gap is then formed between the edge surface and the adhesion surface 240f and an adhesive is filled in the gap, so that the adhesive layer 250 is formed. The thickness direction of the adhesive layer 250 (the vertical direction in FIG. 1) aligns with the main scanning direction α. The adhesion surface 240f is parallel to the optical axis of the coupling lens 112, and only the edge surface of the outer circumference of the coupling lens with a certain angle (90 degrees or less in the example) opposes the adhesion surface 240f, and the adhesive layer 250 is formed. As the adhesive layer 250 is interposed between the housing 240 and a part of the edge surface, the coupling lens 112, which is aligned with the laser light source, is bonded and fixed to the housing 240.

In the first example, the sensitivity of variations due to expansion and contraction is intentionally increased in the thickness direction of the adhesive layer 250. The variations are anisotropic and the thickness direction aligns with the main scanning direction α. With this configuration, if a laser light spot is positionally shifted on the intermediate screen 70 due to the expansion and contraction of the adhesive layer 250 caused by temperature changes, the positional shift of a display image can be corrected by adjusting a write timing. Therefore, the heads-up display device 200 including the optical scanning device 1 of the first example achieves stable image quality.

In the second example, the edge surface of the coupling lens 112 is sandwiched between the paired lens intermediate holding members 260, and the lens intermediate holding members 260 are bonded and fixed to the adhesion surface 240f formed on the housing 240. The two lens intermediate holding members 260 respectively contact the edge surface of the coupling lens 112 at two locations in a direction along the adhesion surface 240f (the sub-scanning direction β) and are bonded to the edge surface, and the direction of sandwiching the edge surface is orthogonal to the main scanning direction α. Similarly to the first example, as the intermediate holding member 260 is interposed between the housing 240 and a part of the edge surface, the coupling lens 112, which is aligned with the laser light source, is bonded and fixed to the housing 240.

In the second example, the sensitivity of variations due to expansion and contraction of the intermediate holding member 260 is intentionally increased in the direction orthogonal to the direction of sandwiching the coupling lens 112. The variations are anisotropic and the orthogonal direction aligns with the main scanning direction α. With this configuration, if a laser light spot is positionally shifted on the intermediate screen 70 due to the expansion and contraction of the lens intermediate holding member 260, the positional shift of a display image can be corrected by adjusting a write timing and stable image quality is achieved.

In the optical scanning device 1 of the present embodiment, the timing sensors (86 and 87), which are optical detection sensors, detect laser light from one of the plurality of laser light sources (the light source elements 111). Based on a detection signal, an image is displayed with a phase difference between image write timings of the laser light sources (111R, 111G, and 111B).

Even if there are an adjustment error due to curing contraction (approximately 3[%] to 5[%]) of an ultraviolet curing adhesive and a difference in the expansion and contraction of an adhesive due to temperature changes, the phase difference described above is set according to the positional shift between laser light spots from the laser light sources or the positional shift of the amplitude center X0. The respective color images are written according to the set phase difference, and thus the timing of detecting laser light emitted from any of the laser light sources and scanned is detected. It is unnecessary to individually detect the timing for each of the laser light sources and the position of each color image can be matched, so that stable image quality can be achieved. The control of detecting a detection timing at the time of a temperature change does not have to be executed only for one laser light source. The timing may be individually detected for each color and a write timing may be individually set for each laser light source. That is, in accordance with the correction of the positional shift of one laser light source, the other two laser light sources may be corrected. Alternatively, the amount of shift may be detected for each laser light source and then the write timing may be adjusted for each laser light source.

Further, the optical scanning device 1 according to the embodiment includes, as optical detection sensors, the scanning-start-side timing sensor 86 on the scanning start side and the scanning-end-side timing sensor 87 on the scanning end side in the main scanning direction α. Since it is possible to detect the timing when scanning reaches the end of an amplitude on the scanning start side and the scanning end side, the timing of irradiating the amplitude center X0 with laser light can be detected from the timing intermediate between the timing when scanning reaches one end of the amplitude and the timing when scanning reaches the other end of the amplitude. It is also possible to detect laser light on the upstream side of the intermediate screen 70 in the scanning direction in both forward scanning from the scanning start side to the scanning end side and backward scanning from the scanning end side to the scanning start side. Consequently, if the direction of writing a display image is different among the laser light sources, it is possible to accurately detect the timing of irradiating the amplitude center X0 with laser light in the forward scanning and the backward scanning. By setting a phase difference according to the amplitude center X0 of laser light, a positional shift of an image in the main scanning direction can be corrected, and thus stable image quality can be achieved.

In the optical scanning device 1 of the present embodiment, the timing sensors (86 and 87), which are optical detection sensors, detect a timing when light to be scanned to an amplitude end passes and a timing when returning laser light passes. With such a configuration, it is possible to detect a shift of the timing of the amplitude center X0 based on the reciprocating time ("ts" or "te") during which scanning returns at the amplitude end. By detecting the shift of the timing of the amplitude center X0 among the laser light sources, the positional shift of laser light spots on the intermediate screen 70 corresponding to the shift of the amplitude center X0 is estimated, and the phase difference between the image write timings described above can be set. If a laser light spot on the intermediate screen 70 is positionally shifted, the position of each color images can be matched and stable image quality can be achieved.

In the optical scanning device 1 according to the present embodiment, as control of correcting a positional shift in the main scanning direction, the write timing is corrected based on a laser light receiving signal for the purpose of avoiding a positional shift of an image. The control of correcting a positional shift in the main scanning direction is not limited to the configuration described in the present embodiment, and any known control can be employed.

SECOND EMBODIMENT

Figure 15:
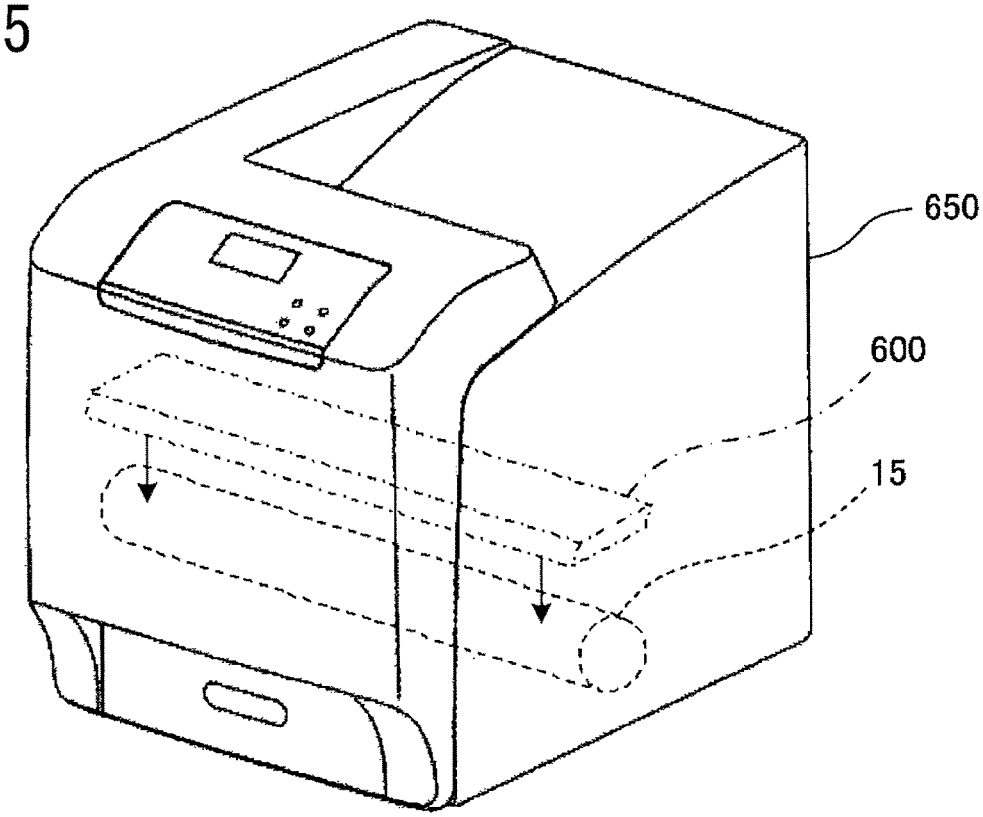
FIG. 15 is a perspective view of a laser printer according to a second embodiment.
Figure 16:
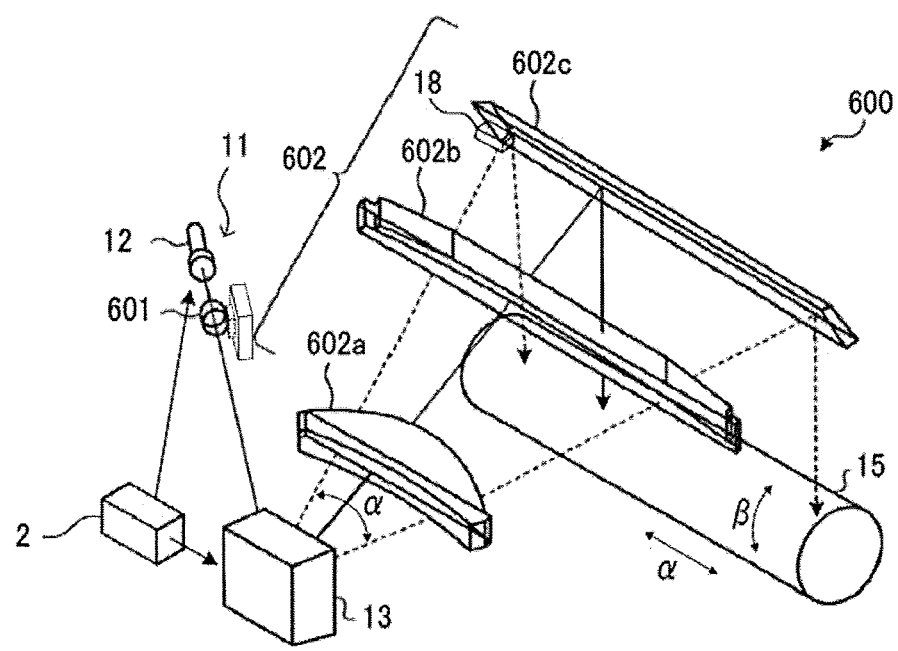
FIG. 16 is an illustration of a configuration of an optical writing device according to the second embodiment.

Next, an optical writing device 600 that includes a configuration similar to the optical scanning device 1 according to the embodiment described above will be described in detail as a second embodiment of the optical scanning device according to the present embodiment. FIG. 15 is a perspective explanatory view of a laser printer 650 that is an example of an image forming apparatus in which the optical writing device 600 is incorporated. FIG. 16 is an internal configuration view of the optical writing device 600.

As illustrated in FIG. 15, the optical writing device 600 is used as a constituent member of an image forming apparatus such as the laser printer 650 having a printer function by laser light or the like. In the image forming apparatus, the optical writing device 600 optically scans a photoconductive drum functioning as a scanned surface 15 with one or a plurality of laser beams, thereby performing optical write on the photosensitive drum.

As illustrated in FIG. 16, in the optical writing device 600, laser light from a light source device 12 such as a laser device passes through an image forming optical system 601 such as a collimator lens, and then is deflected by the light deflector 13 having the reflecting surface 14 in a uniaxial direction or a biaxial direction.

Laser beam deflected by the light deflector 13 then passes through a scanning optical system 602 including a first lens 602a, a second lens 602b, and a reflecting mirror part 602c to be irradiated to the scanned surface 15 (for example, a photoconductive drum or a photosensitive sheet) and optically written on the scanned surface 15. The scanning optical system 602 forms an image of a light beam in a spot shape on the scanned surface 15. At this time, a light receiver 18 is provided in the scanning optical system 602 which is also a surface to be scanned by the light deflector.

In the second embodiment, the light receiver 18 disposed at one end of the reflecting mirror part 602c in the main scanning direction α is capable of detecting laser light near an amplitude end. Based on a detection result, the amplitude center X0 can be detected and thus a positional shift of a laser light irradiation position in the main scanning direction α can be detected. Further, by controlling a timing of writing laser light that forms a latent image on a surface of the photoconductive drum, which is the scanned surface 15, based on the detection result, it is possible to perform correction of forming the latent image at an appropriate position on the photoconductive drum if the laser light irradiation position is shifted.

Arrangements are made so that a direction of displacement of the image forming optical system 601 due to deformation of an attaching part for attaching the image forming optical system 601 to a casing of the optical writing device 600 caused by temperature changes is aligned with the main scanning direction α of the light deflector 13 functioning as a scanning unit. For example, when one end of the image forming optical system 601 in a direction orthogonal to the optical axis of the image forming optical system 601 is fixed to a casing of the optical writing device 600 by an adhesive, arrangements are made so that the thickness direction of an adhesive layer formed by the adhesive is aligned with the main scanning direction. With such an arrangement, if the adhesive layer functioning as an attaching part is deformed by temperature changes, the image forming optical system 601 is moved in the direction orthogonal to the optical axis of the image forming optical system 601, that is, the main scanning direction α. Consequently, the positional shift of the laser light irradiation position due to the movement of the image forming optical system 601 is a positional shift in the main scanning direction α. By controlling the write timing described above, it is possible to perform correction of forming a latent image at an appropriate position on the photoconductive drum.

As described above, the optical writing device 600 is used as the constituent member of the image forming apparatus having the printer function by laser light.

Alternatively, the optical writing device 600 can be used as a constituent member of an image forming apparatus such as a laser labeling device that deflects laser light to a thermal medium, optically scans the thermal medium with laser light, and heats the thermal medium to perform printing.

The above description is only an example and specific effects are achieved for each of the following modes.

(First Mode)

An optical scanning device such as the optical scanning device 1 includes a light source such as the light source element 111, a scanning unit such as the light deflector 13 that deflects light from the light source in a main scanning direction such as a main scanning direction α an a scanned area such as a scannable area with light, an optical member such as the coupling lens 112 that guides light from the light source to the scanning unit, a casing such as the housing 240 that holds the light source and the optical member, and an attaching part such as the adhesive layer 250 and the intermediate holding member 260 that attaches the optical member to the casing. A direction of displacement of the optical member due to deformation of the attaching part caused by temperature changes, that is, a direction in which the attaching part is disposed to attach a part of the optical member to the housing 240 is aligned with a direction corresponding to the main scanning direction of the scanning unit. As described in the above embodiments, the first mode can avoid a failure due to the deformation of the attaching part for attaching the optical member to the casing caused by temperature changes. This is due to the following reason. That is, in the optical scanning device, the light irradiation position on a light irradiation target is likely to be shifted in the main scanning direction due to errors in manufacturing or assembling components. For this reason, the optical scanning device generally has a configuration of avoiding a failure due to a positional shift of the irradiation position in the main scanning direction. As an example, in the optical scanning device of the embodiments described above has a configuration of projecting scanned light onto a projection surface for the purpose of forming an image. In this configuration, an effective scanning area to which light contributing to image formation is irradiated is set within a scannable range in the main scanning direction. The effective scanning area is narrower than the scannable range. Based on the detected amount of positional shift of the irradiation position in the main scanning direction, the timing (write timing) when light for forming an image starts to be irradiated is controlled to form an image at an appropriate position in the effective scanning area. If the direction of displacement of the optical member caused by temperature changes aligns with the direction corresponding to the main scanning direction, the irradiation position of light guided by the optical member is displaced in the main scanning direction. As described above, even when the irradiation position is displaced in the main scanning direction due to temperature changes, it is possible to avoid the failure by the configuration of avoiding the failure due to a positional shift of the irradiation position in the main scanning direction. Consequently, the first mode can avoid the failure due to the deformation of the attaching part for attaching the optical member to the casing caused by temperature changes.

(Second Mode)

In the first mode, the attaching part includes an adhesive layer such as the adhesive layer 250 that bonds the optical member to the casing, the adhesive layer is asymmetrically disposed with respect to an optical axis of the optical member, and a thickness direction of the adhesive layer is aligned with the direction corresponding to the main scanning direction. According to the second mode, as described in the first example, if an irradiation position is shifted by displacement of the optical member due to expansion and contraction of the adhesive layer, a failure due to deformation of the adhesive layer can be avoided by correcting a positional shift of a display image through adjustment of a write timing.

(Third Mode)

In the first mode, the attaching part includes an intermediate holding member such the an intermediate holding member 260 that is brought into contact with the optical member in a direction orthogonal to the main scanning direction and is bonded to the optical member, and the intermediate holding member has an intermediate holding member fixing unit such as the intermediate holding member adhesive layer 270 that extends to fix the optical member to the casing, the intermediate holding member fixing unit is asymmetrically disposed with respect to an optical axis of the optical member, and an extending direction in which the intermediate holding member extends from the intermediate holding member fixing unit to a contact part that contacts the optical member is aligned with the direction corresponding to the main scanning direction. According to the third mode, as described in the second example, if an irradiation position is shifted by displacement of the optical member due to expansion and contraction of the intermediate holding member, it is possible to correct a positional shift of a display image by adjusting a write timing. It is thus possible to avoid a failure due to deformation of the intermediate holding member.

(Fourth Mode)

In any one of the first to third modes, the optical scanning device further includes a light receiving unit such as the scanning-start-side timing sensor 86 that receives light scanned by the scanning unit within a predetermined range of the scanned area such as a scannable range, and a light source controller such as the LD driver 257 that controls a write timing when light from the light source for forming an image starts to be irradiated onto an image forming surface such as the intermediate screen 70 in the scanned area based on a light receiving signal that detects receiving of light by the light receiving unit. According to the fourth aspect, as described in the above embodiments, based on the amount of positional shift of the irradiation position in the main scanning direction, the timing (write timing) when light for forming an image starts to be irradiated is controlled to form an image at an appropriate position on the image forming surface.

(Fifth Mode)

In the fourth mode, the optical scanning device further includes a plurality of the light sources such as three light sources. The light source controller controls the write timing of each of the light sources so as to overlap images formed by light irradiated from the light sources on the image forming surface, and the light receiving unit sets the write timing among the light sources based on a light receiving signal indicating that the light receiving unit receives light irradiated from one of the light sources. According to the fifth mode, as described in the above embodiments, it is only required to receive light from any of the light sources, it is not necessary to individually receive light from the light sources, and positions of the respective color images can be matched. Consequently, stable image quality can be obtained.

(Sixth Mode)

In the fourth or fifth mode, the light receiving unit such as the timing sensor (86, 87) is disposed on both sides of the image forming surface in the main scanning direction to be outside the image forming surface and inside the scanned area. According to the sixth mode, as described in the above embodiments, the detection accuracy of the amplitude center in the main scanning direction is improved. By setting the write timing according to the amplitude center, the positional shift of an image in the main scanning direction can be corrected and stable image quality can be achieved.

(Seventh Mode)

In any one of the fourth to sixth modes, the light receiving unit detects a timing when light to be scanned to an amplitude end passes and a timing when returning scanned light passes. According to the seventh mode, as described in the above embodiments, it is possible to detect a shift of the timing of the amplitude center based on the reciprocating time ("ts" or "te") during which scanning returns at the amplitude end.

(Eighth Mode)

An image projection device such as the heads-up display device 200 includes an optical scanning unit that scans a scanned area with light modulated based on image information, a projection optical system such as the concave mirror 40 that projects light emitted from the optical scanning unit onto a projection surface such as the windshield 302, and the optical scanning device such as the optical scanning device 1 according to any one of the first to seventh mode. According to the eighth mode, as described in the above embodiments, if the temperature changes, stable image quality can be achieved.

(Ninth Mode)

A mobile object such as the automobile 301 includes a mobile unit such as a drive source and a drive wheel, an image projection unit that projects an image such as the virtual image I onto the projection surface such as the windshield 302, and the image projection device such as the heads-up display device 200 according to claim 8. As described in the above embodiments, if the temperature changes, stable image quality can be achieved.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), DSP (digital signal processor), FPGA (field programmable gate array) and conventional circuit components arranged to perform the recited functions.

The invention claimed is:

1. An optical scanning device, comprising:
   a light source;
   a scanning unit configured to deflect light from the light source in a main scanning direction to scan a scanned area with the light;
   an optical member configured to guide the light from the light source to the scanning unit;
   a casing holding the light source and the optical member; and
   an attaching part disposed between the optical member and the casing to attach a part of the optical member to the casing, wherein
   a direction in which the attaching part is disposed is aligned with the main scanning direction of the scanning unit,
   the attaching part includes an adhesive layer that bonds the optical member to the casing, and the adhesive layer is asymmetrically disposed with respect to an optical axis of the optical member on both sides of the optical axis in a direction orthogonal to the main scanning direction.

2. The optical scanning device according to claim 1, wherein
a thickness direction of the adhesive layer is aligned with the direction corresponding to the main scanning direction.

3. The optical scanning device according to claim 1, further comprising:
a light receiver configured to receive light scanned by the scanning unit within a predetermined range of the scanned area; and
a light source controller configured to control a write timing when light from the light source for forming an image starts to be irradiated onto an image forming surface in the scanned area based on a light receiving signal that detects receiving of light by the light receiver.

4. The optical scanning device according to claim 3, further comprising a plurality of the light sources, wherein
the light source controller controls the write timing of each of the light sources so as to overlap images formed by light irradiated from the light sources on the image forming surface, and
the light receiver sets the write timing among the light sources based on a light receiving signal indicating that the light receiver receives light irradiated from one of the light sources.

5. The optical scanning device according to claim 3, further comprising another light receiver, wherein the light receivers are disposed on both sides of the image forming surface in the main scanning direction to be outside the image forming surface and inside the scanned area.

6. The optical scanning device according to claim 3, wherein the light receiver detects a first tuning of light scanning in a first direction and a second timing of light scanning in a second direction.

7. An image projection device comprising:
an optical scanning unit configured to scan a scanned area with light modulated based on image information;
a projection optical system configured to project light emitted from the optical scanning unit onto a projection surface; and
the optical scanning device, as the optical scanning unit, according to claim 1.

8. A mobile object comprising:
a mobile unit;
an image projection unit configured to project an image onto the projection surface; and
the image projection device, as the image projection unit, according to claim 7.

9. The optical scanning device according to claim 4, further comprising another light receiver, wherein the light receivers are disposed on both sides of the image forming surface in the main scanning direction to be outside the image forming surface and inside the scanned area.

10. The optical scanning device according to claim 4, wherein the light receiver detects a first timing of light scanning in a first direction and a second timing of light scanning in a second direction.

11. The optical scanning device according to claim 5, wherein the light receiver detects a first timing of light scanning in a first direction and a second timing of light scanning in a second direction.

12. The optical scanning device according to claim 9, wherein the light receiver detects a first timing of light scanning in a first direction and a second timing of light scanning in a second direction.

13. An optical scanning device, comprising:
a light source;
a scanning unit configured to deflect light from the light source in a main scanning direction to scan a scanned area with the light;
an optical member configured to guide the light from the light source to the scanning unit;
a casing holding the light source and the optical member; and
an attaching part disposed between the optical member and the casing to attach a part of the optical member to the casing, wherein
a direction in which the attaching part is disposed is aligned with the main scanning direction of the scanning unit,
the attaching part includes an intermediate holding member bonded to and in contact with the optical member in a direction orthogonal to the main scanning direction, and the intermediate holding member including an intermediate holding member fixing unit that extends to fix the optical member to the casing, and
the intermediate holding member fixing unit is asymmetrically disposed with respect an optical axis of the optical member.

14. The optical scanning device according to claim 13, further comprising:
a light receiver configured to receive light scanned by the scanning unit within a predetermined range of the scanned area, and
a light source controller configured to control a write timing when light from the light source for forming an image starts to be irradiated onto an image forming surface in the scanned area based on a light receiving signal that detects receiving of light by the light receiver.

15. The optical scanning device of claim 13, wherein an extending direction in which the intermediate holding member extends from the intermediate holding member fixing unit to a contact part that contacts the optical member is aligned with the direction corresponding to the main scanning direction.

* * * * *